(12) United States Patent
Sjöland

(10) Patent No.: US 8,432,962 B2
(45) Date of Patent: Apr. 30, 2013

(54) SWITCHED MODE POWER AMPLIFICATION

(75) Inventor: Henrik Sjöland, Löddeköpinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1130 days.

(21) Appl. No.: 12/306,324

(22) PCT Filed: Jul. 27, 2006

(86) PCT No.: PCT/SE2006/050221
§ 371 (c)(1),
(2), (4) Date: Dec. 23, 2008

(87) PCT Pub. No.: WO2008/002225
PCT Pub. Date: Jan. 3, 2008

(65) Prior Publication Data
US 2009/0238258 A1 Sep. 24, 2009

(51) Int. Cl.
*H03K 7/08* (2006.01)
*H03F 3/38* (2006.01)

(52) U.S. Cl.
USPC ............................................. 375/238; 330/10

(58) Field of Classification Search .................. 375/238; 330/10
See application file for complete search history.

(56) References Cited

U.S. PATENT DOCUMENTS

| 5,973,556 | A | * | 10/1999 | Su | 330/10 |
|---|---|---|---|---|---|
| 6,073,050 | A | * | 6/2000 | Griffith | 607/57 |
| 6,788,137 | B2 | | 9/2004 | Morita | |
| 6,794,931 | B2 | | 9/2004 | Kenington | |
| 6,993,087 | B2 | * | 1/2006 | Rosnell et al. | 375/295 |
| 2004/0046607 | A1 | * | 3/2004 | Grange | 330/10 |
| 2006/0018375 | A1 | * | 1/2006 | Wojtiuk | 375/239 |
| 2006/0178119 | A1 | * | 8/2006 | Jarvinen | 455/114.2 |
| 2007/0014382 | A1 | * | 1/2007 | Shakeshaft et al. | 375/297 |
| 2008/0074207 | A1 | * | 3/2008 | McCune et al. | 332/109 |

FOREIGN PATENT DOCUMENTS

| EP | 0385641 A2 | | 9/1990 |
|---|---|---|---|
| GB | EP0385641 | * | 2/1990 |
| JP | H04-159803 A | | 6/1992 |
| JP | 2002-151974 A | | 5/2002 |
| WO | WO 2005/119904 A | | 12/2005 |

* cited by examiner

Primary Examiner — David C. Payne
Assistant Examiner — Sarah Hassan

(57) ABSTRACT

The invention concerns a method of amplifying a radio frequency signal, a switched mode power amplifying device and a radio transmission device comprising such a power amplifying device. The switched power amplifying device (10) comprises an envelope signal input (El), an arithmetic combining unit (SUB) between the envelope signal input and a modulating unit (PWM), configured to modulate a modified envelope signal (E') output by the arithmetic combining unit with a carrier (C) for obtaining a modulated signal, an amplifying unit (PA) connected to the modulating unit providing an output signal (O) and a feedback path connected between the amplifying unit (PA) and the arithmetic combining unit (SUB). The feedback path comprises a low pass filter (LPF) for filtering the output signal (O) and a signal processing unit (DSP) processing the filtered signal (Vf) in order to obtain an estimated radio frequency amplitude (AE) for provision to the arithmetic combining unit.

17 Claims, 3 Drawing Sheets

SWITCHED MODE POWER AMPLIFICATION

TECHNICAL FIELD OF THE INVENTION

The present invention relates to the field of switched mode radio frequency power amplifiers. More particularly the present invention relates to a method of amplifying a radio frequency signal, a switched mode power amplifying device and a radio transmission device comprising such a power amplifying device.

DESCRIPTION OF RELATED ART

There is a trade-off between efficiency and linearity in RF (radio frequency) power amplifiers. If high linearity is required a class A amplifier can be used, at the cost of low efficiency. If a constant envelope signal is to be transmitted and linearity is not critical, a highly efficient switched mode (class D, E, or F) amplifier can be used.

A number of techniques exist to allow the use of switched mode power amplifiers with non-constant envelope signals. Such techniques are used in base-stations for mobile telephony, and also in cellular phones operating in 2.5 G systems and above. One technique described by L. R. Kahn in "Single sideband transmission by envelope elimination and restoration", Proceedings of the IRE, vol. 40, pp. 803-806, July 1952, which can be mentioned is envelope elimination and restoration (EER), where the switched mode power amplifier is operating on a constant envelope signal and the amplitude modulation is accomplished by using a DC-DC converter to modulate the supply voltage. The major drawback is the need of a fast DC-DC converter with a high efficiency and low amount of spurious signals. The linearity of the system also remains an issue, since the phase shift of the amplifier is voltage dependent, and the amplitude is not exactly proportional to the supply voltage. The problem is exaggerated if the signals have a large amplitude variation. A linearization technique, such as pre-distortion, can be applied to improve the linearity.

The main problem with existing solutions is that they cannot provide a high efficiency while meeting the demanding linearity requirements of 2.5 G systems and above. One way to improve the efficiency would be to remove the DC-DC converter in the EER. This can be accomplished by using a delta-sigma modulator before the switched-mode power amplifier. This is for instance described by J. Ketola et. Al in "Transmitter Utilising Bandpass Delta-Sigma Modulator and Switching Mode Power Amplifier", Proceedings ISCAS 2004, pp. 1-633-636, as well as by J. Sommarek et. al. in "A Digital Modulator with Bandpass Delta-Sigma Modulator", Proceedings of ESSCIRC 2004. pp. 159-162. The effect of the modulator can in some cases be regarded as using a DC-DC Converter without output filter, just turning the supply voltage on and off. See for instance Y. Wang, "A class-S RF amplifier architecture with envelope delta-sigma modulation", in Proceedings of RAWCON 2002, pp. 177-179 and Y. S. Jeon et. al. "A novel high-efficiency linear transmitter using injection-locked pulsed oscillator", IEEE Microwave and Wireless Components Letters, vol. 15, no. 4, pp. 214-216, April 2005. Since a large amount of spurious signals will then be generated it is essential how the modulator and antenna filter are realized to ensure that too strong spurious signals are not transmitted, blocking the reception in other channels. Dependent on how the modulator operates different mechanisms causing non-linearity will be present, and schemes for improving the linearity are essential.

There is therefore a need for improving the linearity of switched mode power amplifiers.

SUMMARY OF THE INVENTION

The present invention is directed towards enabling the provision of power efficient radio frequency transmission with good linear behaviour.

One object of the present invention is to provide a method of amplifying a radio frequency signal, which enables the provision of power efficient radio frequency transmission with good linear behaviour.

According to a first aspect of the present invention this is achieved by a method of amplifying a radio frequency signal comprising the steps of:
receiving an envelope signal,
arithmetically combining an estimated radio frequency amplitude with the envelope signal for obtaining a modified envelope signal,
modulating the modified envelope signal with a carrier for obtaining a modulated signal,
amplifying said modulated signal for obtaining an output signal,
low pass filtering the output signal, and
processing the filtered signal for obtaining an estimated radio frequency amplitude.

Another object of the present invention is to provide a switched mode power amplifying device, which shows a good linear behaviour.

According to a second aspect of the present invention this is achieved by a switched mode power amplifying device comprising:
an envelope signal input,
an arithmetic combining unit having a first input connected to the envelope signal input and providing a modified envelope signal,
a modulating unit for receiving the modified envelope signal and configured to modulate this signal with a carrier for obtaining a modulated signal,
an amplifying unit connected to the modulating unit for amplifying said modulated signal in order to obtain an output signal,
a feedback path connected between an output of the amplifying unit and a second input of the arithmetic combining unit, said feedback path comprising
   a low pass filter for low pass filtering the output signal, and
   at least one signal processing unit for processing the filtered signal in order to obtain an estimated radio frequency amplitude for provision to the second input of the arithmetic combining unit.

The power amplifying device may with advantage be provided in a radio transmission device such as a base station or a mobile station.

The invention has the following advantages. It provides a more linear mode of operation. At the same time it has a high efficiency. According to the invention the low frequency content of the output signal is measured, which is related to the RF output, and from that the RF amplitude can be calculated and fed back. The feedback structure is furthermore simple, which is achieved by measuring the low frequency content of the output signal rather than the RF output itself, which can result in reduced power consumption. The feedback will be especially effective for suppressing distortion due to the switches not being able to turn on completely for the very short pulses generated at low output amplitudes.

It should be emphasized that the term "comprises/comprising" when used in this specification is taken to specify the presence of stated features, steps or components, but does not preclude the presence or addition of one or more other features, steps, components or groups thereof.

BRIEF DESCRIPTION OF THE DRAWINGS

The present invention will now be described in more detail in relation to the enclosed drawings, in which.

DETAILED DESCRIPTION OF EMBODIMENTS

The present invention relates to a switched mode RF (radio frequency) power amplifier that can be used advantageously for communication in wireless networks for instance in 2.5 G networks and above. There is a problem with RF power amplifiers in that they have a poor linearity if a good efficiency is also desired. The present invention is directed towards improving the linearity of such amplifiers. At the same time a good efficiency is retained.

Figure 1:
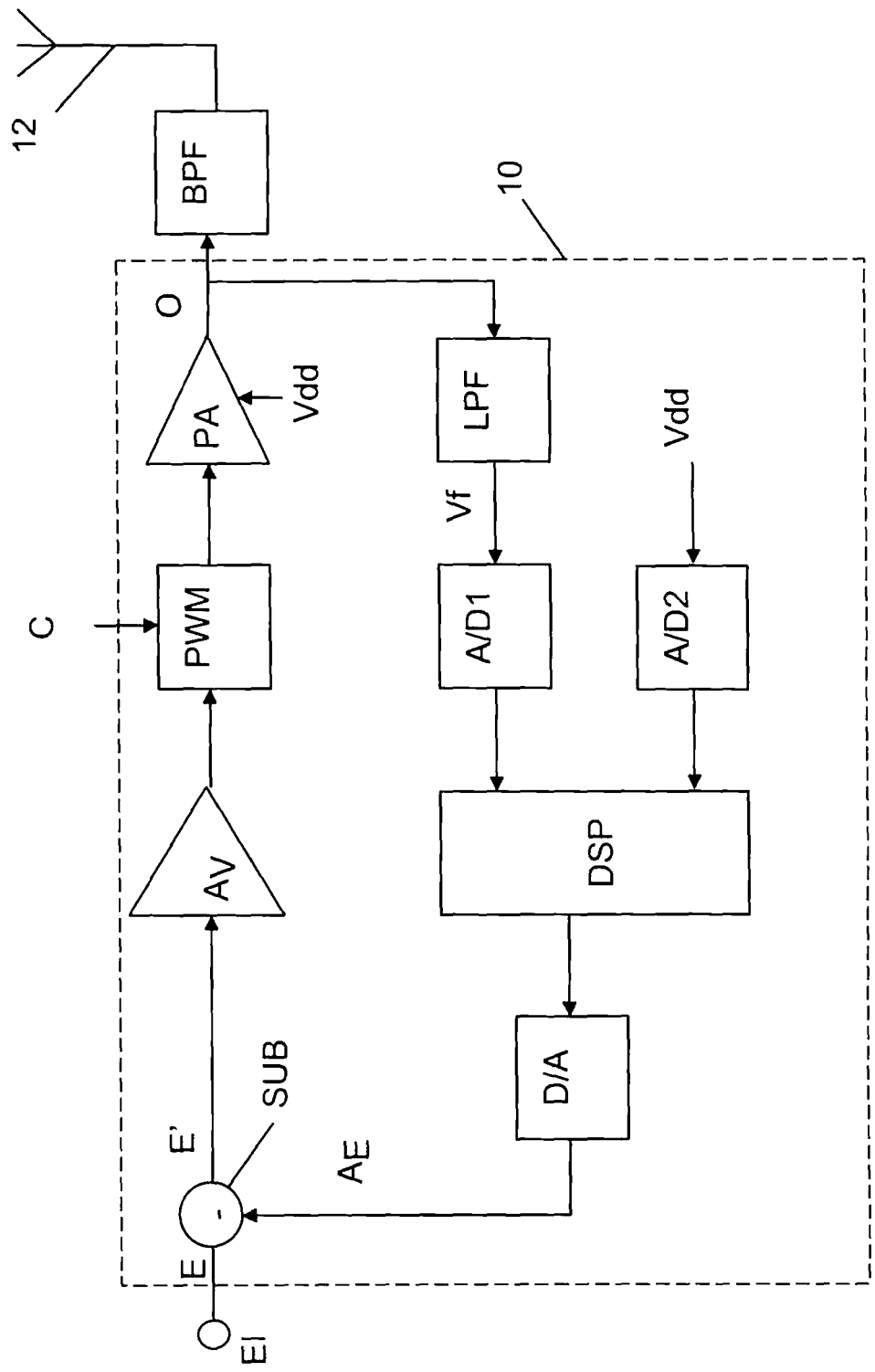
FIG. 1 shows a block schematic of a switched mode power amplifying device according to an embodiment of the present invention.

Such a switched mode power amplifying device 10 is shown in a block schematic in FIG. 1. The power amplifying device 10 is indicated by a dashed box including a number of different units. The power amplifying device 10 includes an envelope signal input E1, which envelope signal input E1 is connected to a first input of an arithmetic combining unit that in this embodiment is a subtracting unit SUB. The subtracting unit SUB has an output that is connected to an input of an amplifying stage $A_v$ having an output connected to an input of a modulating unit PWM. The modulating unit PWM is in this embodiment a pulse width modulating unit and also receives, via a second input, a carrier C having a frequency equal to the radio frequency to be transmitted and provided with phase information content. The modulating unit PWM also has an output connected to an input of an amplifying unit PA, which is the power amplifying stage of the device. The amplifying unit PA receives a supply voltage Vdd and has an output connected to an input of a bandpass filter BPF, which in turn has an output connected to an antenna 12. The bandpass filter BPF and the antenna 12 are here not a part of the power amplifying device 10. The subtracting unit SUB has a second input and a feedback path is connected between the output of the amplifying unit PA and the second input of the subtracting unit SUB. This feedback path includes a lowpass filter LPF having an input connected to the output of the amplifying unit PA and an output connected to the input of a first A/D converter A/D1. An output of the first A/D converter A/D1 is connected to a first input of a signal processing unit DSP. There is furthermore a second A/D converter A/D2, which has an input on which the same supply voltage Vdd is received. The second A/D converter A/D2 has an output connected to a second input of the signal processing unit DSP. The signal processing unit DSP is in this embodiment a digital signal processing unit. The signal processing unit DSP has an output which is connected to the input of a D/A converter D/A, which in turn is connected to the second input of the subtracting unit SUB.

Figure 2:
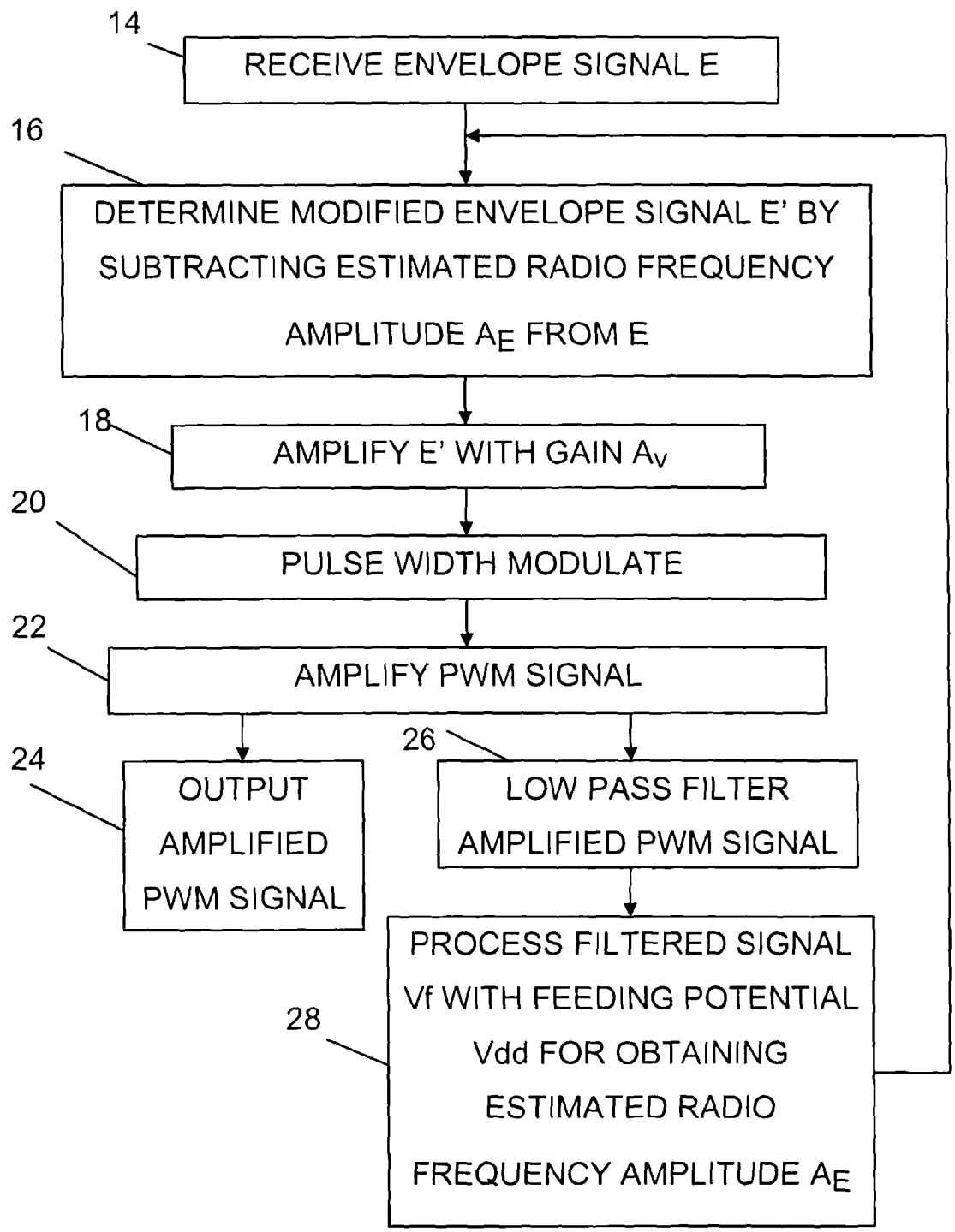
FIG. 2 shows a flow chart of a method of amplifying a radio frequency signal according to an embodiment of the present invention, FIG. 3 schematically shows two radio transmission devices, one base station and one mobile station, communicating with each other, where each may include a power amplifying device according to the invention.

The functioning of the switched mode power amplifying device 10 will now be described with reference being made to FIG. 2, which shows a flow chart outlining its method of operation.

It all starts with an envelope signal E, which in this embodiment is in analog form, being received on the envelope signal input E1, step 14. This envelope signal E is supplied to the arithmetic combining unit SUB, which arithmetically combines the envelope signal E with an estimated radio frequency amplitude $A_E$, and in this embodiment subtracts the estimated radio frequency amplitude $A_E$ from the envelope signal E, for obtaining a modified envelope signal E', step 16. This modified envelope signal E' can also be seen as an envelope error signal. How an estimated radio frequency amplitude $A_E$ is determined will be described later. The modified envelope signal E' is then provided to the amplifying stage $A_v$, where it is amplified with a gain $A_v$, step 18. The resulting signal is then provided to the modulating unit PWM, where it is modulated with the carrier C. The modulation is in this embodiment performed through pulse with modulation, step 20. The carrier C is phase modulated with data that is to be sent using the power amplifying device 10. The phase information is here added by modulating the position of the pulses. The pulse width modulated signal is then provided to the amplifying unit PA, which performs amplification of the PWM signal, step 22. This unit PA is fed by a supply voltage Vdd and therefore provides PWM pulses having an amplitude of Vdd. The amplified PWM signal is then output as an output signal O, step 24, to the bandpass filter BPF for bandpass filtering and then to the antenna 12 for transmission to a receiving device. It is also provided to the low pass filter LPF, which filters out the low frequency content of the output signal O, step 26, and in this way provides a filtered signal Vf. The filtered signal Vf is then provided to the first A/D converter A/D1, which converts the analog version of the filtered signal Vf to a digital version. This digital version of the filtered signal Vf is then provided to the signal processing unit DSP. The signal processing unit DSP also receives the supply voltage Vdd in digital form via the second A/D converter A/D2. The signal processing unit DSP then processes the filtered signal Vf together with the supply voltage in order to provide the estimated radio frequency amplitude $A_E$, step 28, i.e. the RF amplitude of the antenna. This estimated radio frequency amplitude $A_E$ may also be seen as an estimate of the envelope of the output signal O. How the processing is done will be described in more detail shortly. The signal processing unit DSP provides the estimated amplitude $A_E$ to the D/A converter D/A for conversion into analog format. The estimated amplitude $A_E$ is then provided to the subtracting unit SUB, which thus modifies the envelope signal E with this estimated amplitude $A_E$, step 16, for obtaining the modified envelope signal E', closing the feedback loop. This enables the output signal O to be more linear.

Now follows a description of how the radio frequency amplitude estimate may be provided.

It is first assumed that the output signal O from the amplifying unit PA is an ideal periodic signal with fixed pulse width $t_p$ and a fixed period $T_{per}$ between pulses. If the power amplifying unit PA then is assumed to amplify the PWM signal maximally to the level Vdd, i.e. each pulse will have an amplitude of Vdd, then the DC level of the output signal from the amplifying unit PA may be determined as:

$$Vdc = Vdd * (t_p/T_{per})$$

The fundamental radio frequency amplitude A can be determined using a Fourier expansion:

$$A = 2/\pi * Vdd * \sin(\pi * t_p/T_{per})$$

This in turn means that the fundamental frequency is:

$$A = (2/\pi) * Vdd * \sin(\pi * Vdc/Vdd)$$

As can be seen from the equations above, if the DC output voltage Vdc and supply voltage Vdd are known, the fundamental amplitude can be calculated. In a real switched mode power amplifying device operating at high frequencies, the output voltage is less ideal, but still the fundamental radio frequency amplitude is possible to estimate from the output DC voltage. When using a modulated signal, the RF amplitude can be estimated based on the low frequency output Vf, derived from the output signal using the above mentioned low pass filter.

Thus for less than ideal output voltages an estimated radio frequency amplitude can be determined as:

$$A_E = (2/\pi) * Vdd * \sin(\pi * Vf/Vdd)$$

In case the amplitude of the output signal is different than Vdd, then that amplitude should be used in the equation above instead. In order to correct for certain non-linear mechanisms in the switched mode power amplifying device, correction terms can be used in the expression above. Since the signal processing unit operates on signals having a bandwidth related to the modulation bandwidth of the signal, it is advantageous to perform the amplitude estimation using digital circuits.

It should however be realised that the RF amplitude estimation may also be performed using analog signals, in which case there would be no need for the D/A and A/D conversion units. It is also possible to have a digital envelope signal, in which case the D/A converting unit may be moved to between the subtracting unit SUB and the amplifying stage $A_v$.

By supplying the DSP with information about both the low-frequency content of the output signal and the supply voltage, it can estimate the RF output amplitude, regardless of variations in the supply voltage. The gain $A_v$ of the amplifying stage $A_v$ is set to achieve a sufficiently high loop gain, but not so high that stability problems occur. The low pass filter LPF is in combination with the (frequency dependent) amplifying stage $A_v$ responsible for shaping the gain to ensure stability, for instance by introducing a dominant pole.

The pulse width modulating unit (PWM) can be realized in a number of different ways. One is to use an integrator creating a (phase modulated) triangular wave at the carrier frequency. A comparator is then used to compare this triangular wave to the signal from the amplifying stage $A_v$. The output of the comparator is the PWM Signal. Another alternative is to feed the phase modulated carrier to two time delaying units controlled by the signal from the amplifying stage $A_v$. If the time delays have opposite characteristics, that is one time delay is increased by the same amount as the other is reduced for a change in the control signal, a PWM signal can be created by feeding the two delayed signals to an AND gate.

The above mentioned operation of the power amplifying device 10 has several advantages. It provides a more linear mode of operation. At the same time it has a high efficiency. It therefore enables the provision of a power efficient radio frequency transmission with good linear behaviour. This arrangement measures the low frequency content of the output signal, which is related to the RF output, and from that the RF amplitude can be calculated and fed back. The feedback structure is furthermore simple, which is achieved by measuring the low frequency content of the output signal rather than the RF output itself, which can result in reduced power consumption. The feedback will be especially effective for suppressing distortion due to the switches not being able to turn on completely for the very short pulses generated at low output amplitudes.

Through using pulse width modulation (PWM) instead of delta sigma modulation (DSM) the generation of large amounts of quantization noise and in-band spurious signals (interference) is avoided. The delta-sigma modulator has large amounts of quantization noise, which can only be suppressed using a very high clock frequency, requiring substantial power. The pulse-width modulator can thanks to its simplicity be very power efficient. The simple modulation also requires a minimum number of switch transitions of the output stage. This also simplifies the design of the bandpass filter before the antenna, which can reduce both cost and power consumption.

Figure 3:
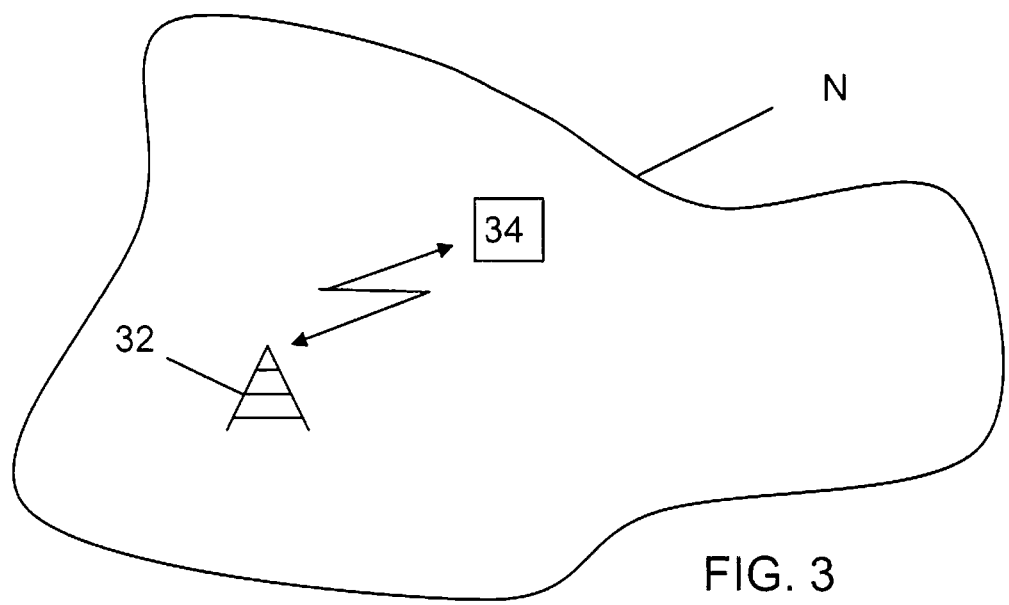
Figure 4:
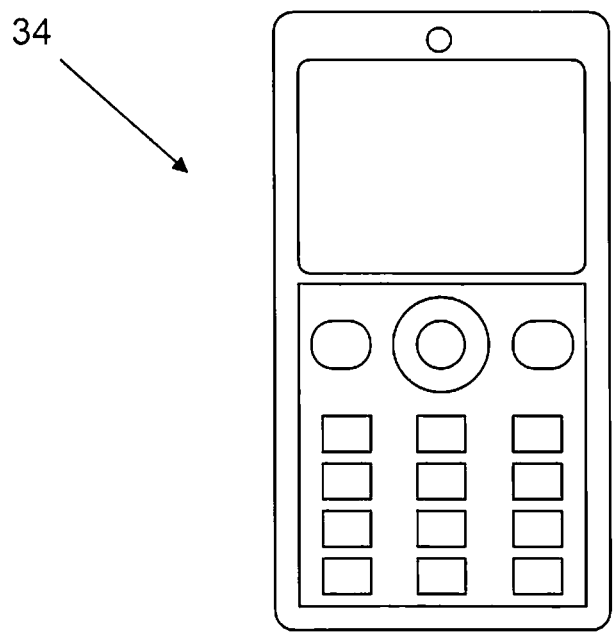
FIG. 4 shows a front view of a mobile station in the form of a cellular phone.

The power amplifying device according to the invention may be provided in either a base station or a mobile station or in both. FIG. 3 schematically shows one such base station 32 communicating with a mobile station 34 in a wide area network N. Here both these are provided with a power amplifying device according to the invention. The mobile station may be a cellular phone, which is shown in FIG. 4.

There are a number of further variations that can be made to the present invention in addition to those already mentioned. The amplifying stage $A_v$ may be omitted. The arithmetic combining unit was here described as a subtracting unit. It may also be provided in the form of an adding unit. The modulation unit is not limited to a PWM modulating unit, but may for instance also be a delta-sigma modulation unit. In the embodiment described above, the supply voltage was used in the estimation of the signal amplitude. This is advantageous because it requires little extra components. However it may be possible to determine the amplitude of the output signal in other ways. Alternatively, if the supply voltage is sufficiently stable, it does not need to be measured. This means that information of the supply voltage may be stored in the digital signal processing unit, thus removing the need for the second A/D converter.

Although the present invention has been described in connection with specific embodiments, it is not intended to be limited to the specific form set forth herein. Rather, the scope of the present invention is limited only by the accompanying claims.

The invention claimed is:

1. A method of amplifying a radio frequency signal, comprising the steps of:
   receiving an envelope signal;
   arithmetically combining an estimated radio frequency amplitude with the envelope signal for obtaining a modified envelope signal;
   modulating the modified envelope signal with a carrier for obtaining a modulated signal;
   amplifying said modulated signal for obtaining an output signal,
   low pass filtering the output signal; and,
   processing the filtered signal, based also on the amplitude of the output signal, for obtaining the estimated radio frequency amplitude to be used when arithmetically combining.

2. The method according to claim 1, wherein the amplitude of the output signal is set as a supply voltage used for amplifying the modulated signal.

3. The method according to claim 1, wherein the processing of the filtered signal is based on a Fourier expansion for the estimated radio frequency amplitude.

4. The method according to claim 1, wherein the estimated radio frequency amplitude is obtained through the expression:

$$A_E=(2/\pi)*Vdd*\sin(\pi*Vf/Vdd),$$

where Vf is the filtered signal, Vdd is the amplitude of the output signal and $A_E$ is the estimated radio frequency amplitude.

5. The method according to claim 1, wherein the step of processing the filtered signal is performed on digital signals, while the modulated signal and output signal are analog signals.

6. The method according to claim 1, wherein the step of processing the envelope signal and modified envelope signal comprises pulse width modulating the signal using the carrier.

7. A switched mode power amplifying device, comprising:
an envelope signal input;
an arithmetic combining unit having a first input connected to the envelope signal input and providing a modified envelope signal;
a modulating unit for receiving the modified envelope signal and configured to modulate this signal with a carrier for obtaining a modulated signal;
an amplifying unit connected to the modulating unit for amplifying said modulated signal in order to obtain an output signal;
a feedback path connected between an output of the amplifying unit and a second input of the arithmetic combining unit, said feedback path comprising:
a low pass filter for low pass filtering the output signal, and at least one signal processing unit for processing the filtered signal in order to obtain an estimated radio frequency amplitude, wherein the signal processing unit receives the amplitude of the output signal in order to base the obtaining of the estimated radio frequency amplitude also on this, and for provision of the estimated radio frequency amplitude to the second input of the arithmetic combining unit.

8. The switched mode power amplifying device according to claim 7, wherein the signal processing unit receives a supply voltage used by the amplifying unit as the amplitude of the output signal.

9. The switched mode power amplifying device according to claim 7; wherein the processing of the filtered signal is based on a Fourier expansion for the estimated radio frequency amplitude.

10. The switched mode power amplifying device according to claim 7, wherein the estimated signal pulse amplitude is obtained through the expression:

$$A_E=(2/\pi)*Vdd*\sin(\pi*Vf/Vdd)$$

where Vf is the filtered signal, Vdd is the amplitude of the output signal and $A_E$ is the estimated signal pulse amplitude.

11. The switched mode power amplifying device according to claim 7, further comprising at least one A/D converter in the feedback path in order to provide digital signals to the signal processing unit and a D/A converter for ensuring that the modulating unit receives analog signals, wherein the signal processing unit is a digital signal processing unit.

12. The switched mode power amplifying device according to claim 7, wherein the D/A converter is connected in the feedback path between the signal processing unit and the arithmetic combining unit.

13. The switched mode power amplifying device according to claim 12, wherein the D/A converter is connected between the arithmetic combining unit and the modulating unit.

14. The switched mode power amplifying device according to claim 7, wherein the 20 modulating unit is a pulse width modulating unit.

15. A radio transmission device comprising:
at least one switched power amplifying device, wherein the at least one switched power amplifying device comprises:
an envelope signal input;
an arithmetic combining unit having a first input connected to the envelope signal input and providing a modified envelope signal;
a modulating unit for receiving the modified envelope signal and configured to modulate this signal with a carrier for obtaining a modulated signal, an amplifying unit connected to the modulating unit for amplifying said modulated signal in order to obtain an output signal;
a feedback path connected between an output of the amplifying unit and a second input of the arithmetic combining unit, said feedback path comprising;
a low pass filter for low pass filtering the output signal, and at least one signal processing unit for processing the filtered signal in order to obtain an estimated radio frequency amplitude, wherein the signal processing unit receives the amplitude of the output signal in order to base the obtaining of the estimated radio frequency amplitude also on this, and for provision of the estimated radio frequency amplitude to the second input of the arithmetic combining unit.

16. The radio transmission device according to claim 15, wherein the radio transmission device comprises a base station.

17. The radio transmission device according to claim 15, wherein the radio transmission device comprises a mobile station.

* * * * *

UNITED STATES PATENT AND TRADEMARK OFFICE
CERTIFICATE OF CORRECTION

PATENT NO.        : 8,432,962 B2                                                    Page 1 of 1
APPLICATION NO.   : 12/306324
DATED             : April 30, 2013
INVENTOR(S)       : Sjoland It is certified that error appears in the above-identified patent and that said Letters Patent is hereby corrected as shown below:

In the Claims

In Column 7, Line 44, in Claim 9, delete "claim 7;" and insert -- claim 7, --, therefor.

In Column 8, Line 18, in Claim 14, delete "the 20" and insert -- the --, therefor.

Signed and Sealed this
Sixth Day of August, 2013

Teresa Stanek Rea
*Acting Director of the United States Patent and Trademark Office*